United States Patent
Komura

(10) Patent No.: US 8,659,368 B2
(45) Date of Patent: Feb. 25, 2014

(54) SURFACE ACOUSTIC WAVE FILTER DEVICE

(75) Inventor: Tomohisa Komura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 308 days.

(21) Appl. No.: 13/268,150

(22) Filed: Oct. 7, 2011

(65) Prior Publication Data

US 2012/0086524 A1    Apr. 12, 2012

(30) Foreign Application Priority Data

Oct. 12, 2010   (JP) ................................. 2010-229875

(51) Int. Cl.
*H03H 9/64*    (2006.01)
*H03H 9/00*    (2006.01)

(52) U.S. Cl.
USPC .......................................... 333/133; 333/195

(58) Field of Classification Search
USPC .................... 333/133, 193, 194, 195, 196
See application file for complete search history.

(56) References Cited

U.S. PATENT DOCUMENTS

| | | | |
|---|---|---|---|
| 6,339,365 B1 | 1/2002 | Kawase et al. | |
| 7,436,272 B2 * | 10/2008 | Fujii et al. | ...... 333/187 |
| 8,004,370 B2 * | 8/2011 | Yamagata | ...... 333/133 |
| 8,179,207 B2 * | 5/2012 | Tanaka | ...... 333/133 |
| 8,471,653 B2 * | 6/2013 | Tsuda | ...... 333/196 |
| 2003/0058066 A1 | 3/2003 | Taniguchi et al. | |
| 2003/0107454 A1 | 6/2003 | Nakamura et al. | |

FOREIGN PATENT DOCUMENTS

| | | |
|---|---|---|
| EP | 2 141 805 A2 | 1/2010 |
| JP | 2001-189639 A | 7/2001 |
| JP | 2002-141771 A | 5/2002 |
| JP | 2003-204243 A | 7/2003 |
| JP | 2010-011300 A | 1/2010 |

OTHER PUBLICATIONS

Official Communication issued in corresponding Japanese Patent Application No. 2010-229875, mailed on Dec. 11, 2012.

* cited by examiner

*Primary Examiner* — Dean O Takaoka
(74) *Attorney, Agent, or Firm* — Keating & Bennett, LLP

(57) ABSTRACT

An IDT electrode defining any one of a plurality of surface acoustic wave resonators defining series arm resonators and parallel arm resonators, except for the IDT electrode having a smallest amount of heat generation per unit time when a signal flows between first and second signal terminals, does not face wiring electrodes.

6 Claims, 9 Drawing Sheets

SURFACE ACOUSTIC WAVE FILTER DEVICE

BACKGROUND OF THE INVENTION

1. Field of the Invention

The present invention relates to a surface acoustic wave filter device.

2. Description of the Related Art

In the related art, for example, in Japanese Unexamined Patent Application Publication No. 2010-11300, various surface acoustic wave filter devices that utilize surface acoustic waves have been proposed as band-pass filters, demultiplexers, and the like included in RF (Radio Frequency) circuits in communication apparatuses, such as mobile phones.

FIG. 9 is a schematic circuit diagram of a surface acoustic wave demultiplexer disclosed in Japanese Unexamined Patent Application Publication No. 2010-11300. As shown in FIG. 9, a surface acoustic wave demultiplexer 100 includes an antenna terminal 101, a transmission side signal terminal 102, and first and second reception side signal terminals 103a and 103b. A transmission filter 104 is connected between the antenna terminal 101 and the transmission side signal terminal 102. Meanwhile, a reception filter 105 is connected between the antenna terminal 101 and the first and second reception side signal terminals 103a and 103b. The transmission filter 104 is a ladder type surface acoustic wave filter and includes a plurality of surface acoustic wave resonators, a plurality of capacitors, and a plurality of inductors. The reception filter 105 is a longitudinally-coupled resonator type surface acoustic wave filter.

The surface acoustic wave demultiplexer 100 includes a transmission filter chip 106 in which a portion of the transmission filter 104 is provided, and a reception filter chip 107 in which a portion of the reception filter 105 is provided. The transmission filter chip 106 and the reception filter chip 107 are flip-chip-mounted on a wiring board that is not shown.

A surface acoustic wave filter device that includes a surface acoustic wave filter chip and a wiring board on which a surface acoustic wave filter chip is flip-chip-mounted as in the surface acoustic wave demultiplexer 100, is desired to have high power durability.

SUMMARY OF THE INVENTION

Preferred embodiments of the present invention provide a surface acoustic wave filter device that provides excellent power durability.

According to a preferred embodiment of the present invention, a surface acoustic wave filter device preferably includes first and second signal terminals and a surface acoustic wave filter portion that is connected between the first signal terminal and the second signal terminal and that includes a plurality of surface acoustic wave resonators. The surface acoustic wave filter device preferably includes a surface acoustic wave filter chip and a wiring board. In the surface acoustic wave filter chip, the plurality of surface acoustic wave resonators are provided. The wiring board includes first and second principal surfaces. The surface acoustic wave filter chip is mounted on the first principal surface. The first and second signal terminals are provided on the second principal surface. The wiring board preferably includes a plurality of land electrodes that are provided on the first principal surface and that are connected to the surface acoustic wave filter chip, and a wiring electrode that is provided on the first principal surface and that is connected to at least one of the plurality of land electrodes. The surface acoustic wave filter chip includes a piezoelectric substrate and IDT electrodes. The IDT electrodes are preferably provided on a surface of the piezoelectric substrate that faces the wiring board. The IDT electrodes define the surface acoustic wave resonators. An IDT electrode defining any one of surface acoustic wave resonators among the plurality of surface acoustic wave resonators, other than a surface acoustic wave resonator having a smallest amount of heat generation per unit time when a signal flows between the first and second signal terminals, does not face the wiring electrode. According to this configuration, the surface acoustic wave filter device has excellent power durability.

In the preferred embodiments of the present invention, the IDT electrode not facing the wiring electrode indicates that, of the area of a region in which the IDT electrode is provided, the area of a portion that does not face a portion of the wiring electrode that is provided on the first principal surface is equal to or greater than about 90%, for example.

According to a preferred embodiment of the present invention, in the surface acoustic wave filter device, an IDT electrode defining a surface acoustic wave resonator having a largest amount of heat generation per unit time when a signal flows between the first and second signal terminals, among the plurality of surface acoustic wave resonators, preferably does not face the wiring electrode. According to this configuration, the power durability of the surface acoustic wave filter device is further improved.

According to another preferred embodiment of the present invention, in the surface acoustic wave filter device, all of the IDT electrodes defining the plurality of surface acoustic wave resonators preferably do not face the wiring electrode. According to this configuration, the power durability of the surface acoustic wave filter device is further improved further.

According to another preferred embodiment of the present invention, in the surface acoustic wave filter device, the surface acoustic wave filter portion is preferably a ladder type surface acoustic wave filter portion.

According to still another preferred embodiment of the present invention, in the surface acoustic wave filter device, the wiring electrode preferably defines an inductor.

According to still another preferred embodiment of the present invention, in the surface acoustic wave filter device, the surface acoustic wave filter portion preferably defines a transmission filter. In this case, great power is applied to the IDT electrode, and thus, a superior effect of improving the power durability is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
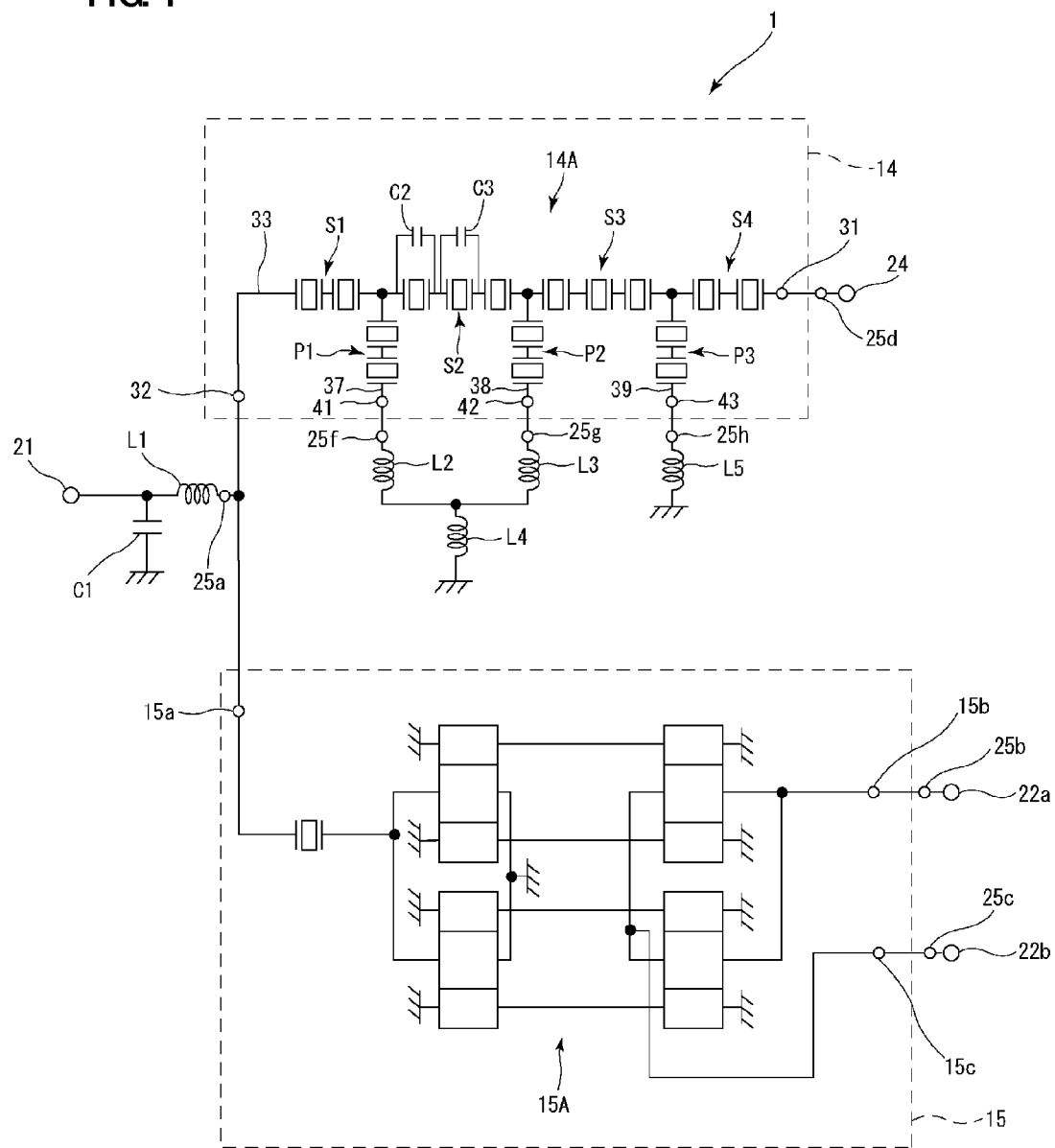
FIG. 1 is a schematic circuit diagram of a duplexer according to a preferred embodiment of the present invention.
Figure 2:
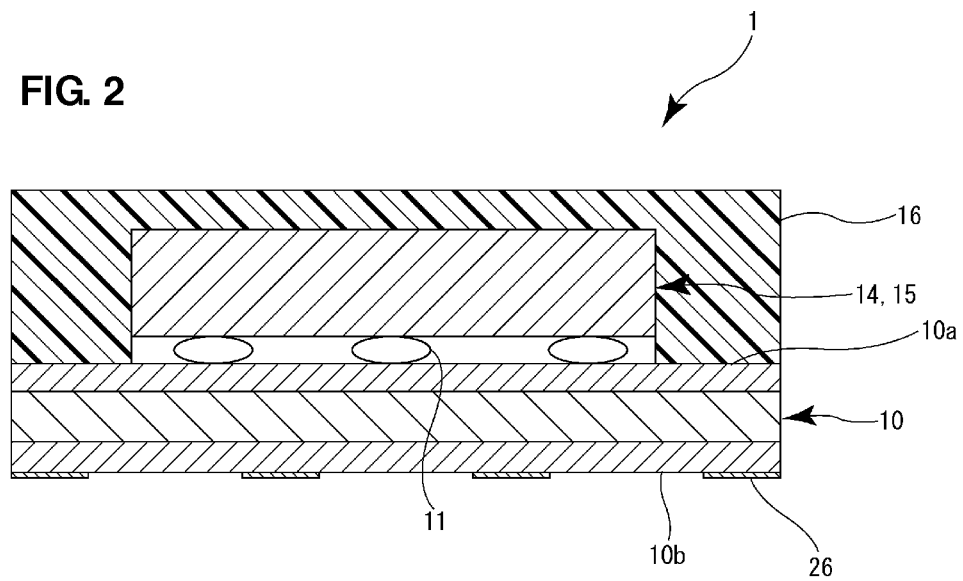
FIG. 2 is a schematic cross-sectional view of the duplexer according to a preferred embodiment of the present invention.

Hereinafter, preferred embodiments of the present invention will be described using, as an example, a duplexer 1 that is one type of a surface acoustic wave filter device and that is shown in FIGS. 1 and 2. It should be noted that the duplexer 1 is merely illustrative. A surface acoustic wave filter device according to preferred embodiments of the present invention is not limited to the duplexer 1. The surface acoustic wave filter device according to preferred embodiments of the present invention may include, for example, only one filter portion, or may be, for example, a demultiplexer other than a duplexer, such as a triplexer.

The duplexer 1 of the present preferred embodiment is preferably included in an RF (Radio Frequency) circuit of a mobile phone compatible with CDMA (Code Division Multiple Access) system such as UMTS (Universal Mobile Telecommunications System), for example. The duplexer 1 preferably is a duplexer designed for use in UMTS-BAND 2, for example. The transmission frequency band of UMTS-BAND 2 is about 1850 MHz to about 1910 MHz, and the reception frequency band of UMTS-BAND 2 is about 1930 MHz to about 1990 MHz.

FIG. 1 is a schematic circuit diagram of the duplexer 1 of the present preferred embodiment. FIG. 2 is a schematic cross-sectional view of the duplexer 1 of the present preferred embodiment. As shown in FIG. 1, the duplexer 1 preferably includes an antenna terminal 21, a transmission side signal terminal 24, and first and second reception side signal terminals 22a and 22b. A transmission filter is connected between the antenna terminal 21 and the transmission side signal terminal 24. A reception filter is connected between the antenna terminal 21 and the first and second reception side signal terminals 22a and 22b.

As shown in FIG. 2, the duplexer 1 preferably includes a wiring board 10, a transmission side surface acoustic wave filter chip 14, and a reception side surface acoustic wave filter chip 15. In the transmission side surface acoustic wave filter chip 14, a portion of the transmission filter is provided. In the reception side surface acoustic wave filter chip 15, a portion of the reception filter is provided. As shown in FIG. 2, the transmission side surface acoustic wave filter chip 14 and the reception side surface acoustic wave filter chip 15 are preferably flip-chip-mounted on a die-attach surface 10a of the wiring board 10 by bumps 11. On the wiring board 10, a sealing resin layer 16 is provided so as to cover the transmission side surface acoustic wave filter chip 14 and the reception side surface acoustic wave filter chip 15. In other words, the duplexer 1 of the present preferred embodiment is preferably a CSP (Chip Size Package) surface acoustic wave filter device, for example.

On a back surface 10b of the wiring board 10, a plurality of terminals 26 are preferably provided as shown in FIG. 2. The plurality of terminals 26 include the antenna terminal 21, the transmission side signal terminal 24, and the first and second reception side signal terminals 22a and 22b. The wiring board 10 is preferably a ceramic multilayer board made of alumina, for example. It should be noted that the wiring board 10 may also be a printed wiring board made of a resin, for example.

The reception side surface acoustic wave filter chip 15 preferably includes a longitudinally-coupled resonator type surface acoustic wave filter portion 15A provided on a piezoelectric substrate that is not shown. In the duplexer 1 of the present preferred embodiment, the reception filter is defined by the longitudinally-coupled resonator type surface acoustic wave filter portion 15A. The longitudinally-coupled resonator type surface acoustic wave filter portion 15A is preferably a filter portion having a balance-unbalance conversion function. The longitudinally-coupled resonator type surface acoustic wave filter portion 15A preferably includes an unbalanced signal terminal 15a and first and second balanced signal terminals 15b and 15c. A one-port surface acoustic wave resonator and four three-IDT longitudinally-coupled resonator type surface acoustic wave filter portions are connected between the unbalanced signal terminal 15a and the first and second balanced signal terminals 15b and 15c. The unbalanced signal terminal 15a is connected to the antenna terminal 21. The first and second balanced signal terminals 15b and 15c are connected to the first and second reception side signal terminals 22a and 22b, respectively.

In the present preferred embodiment, the impedance of the unbalanced signal terminal 15a is preferably about 50Ω, for example. The impedances of the first and second balanced signal terminals 15b and 15c are preferably about 100Ω, for example. In the duplexer 1 of the present preferred embodiment, the reception filter is preferably defined by the longitudinally-coupled resonator type surface acoustic wave filter portion 15A. However, the reception filter may be defined by a ladder type surface acoustic wave filter portion.

The transmission side surface acoustic wave filter chip 14 preferably includes a ladder type surface acoustic wave filter portion 14A. In the duplexer 1 of the present preferred embodiment, the transmission filter is preferably defined by the ladder type surface acoustic wave filter portion 14A. As shown in FIG. 1, the ladder type surface acoustic wave filter portion 14A is connected between the antenna terminal 21 and the transmission side signal terminal 24.

The ladder type surface acoustic wave filter portion 14A includes a series arm 33 connecting between the antenna terminal 21 and the transmission side signal terminal 24. On the series arm 33, series arm resonators S1 to S4 are connected in series. In the present preferred embodiment, each of the series arm resonators S1 to S4 is preferably defined by a plurality of surface acoustic wave resonators but functions as one resonator. Since each of the series arm resonators S1 to S4 is defined by a plurality of surface acoustic wave resonators as described above, the power durability of the ladder type surface acoustic wave filter portion 14A is improved. It should be noted that each of the series arm resonators S1 to S4 may be defined by one surface acoustic wave resonator.

Capacitors C2 and C3 are respectively connected in parallel with two of the three surface acoustic wave resonators defining the series arm resonator S2. Due to the capacitors C2 and C3, the anti-resonant frequency of the series arm resonator S2 shifts to the low frequency side. Thus, the capacitors C2 and C3 enable the steepness of the filter characteristics of the transmission filter to be increased.

The ladder type surface acoustic wave filter portion 14A includes parallel arms 37 to 39 connected between the series arm 33 and a ground. On the parallel arms 37 to 39, parallel arm resonators P1 to P3 are provided, respectively. In the present preferred embodiment, each of the parallel arm resonators P1 to P3 is preferably defined by a plurality of surface acoustic wave resonators but functions as one resonator. Since each of the parallel arm resonators P1 to P3 is defined by a plurality of surface acoustic wave resonators as described above, the power durability of the ladder type surface acoustic wave filter portion 14A is improved. It should be noted that each of the parallel arm resonators P1 to P3 may be defined by one surface acoustic wave resonator.

An inductor L2 is connected between the parallel arm resonator P1 and the ground. An inductor L3 is connected between the parallel arm resonator P2 and the ground. An inductor L4 is connected between the inductors L2 and L3 and the ground. An inductor L5 is connected between the parallel arm resonator P3 and the ground. It should be noted that the inductors L2 to L5 are preferably defined by the wiring board 10.

In the duplexer 1 of the present preferred embodiment, a matching circuit is connected between a common connection point of the transmission filter and the reception filter and the antenna terminal 21 and is preferably defined by an inductor L1 and a capacitor C1. The inductor L1 is connected between the common connection point of the transmission filter and the reception filter and the antenna terminal 21. The capacitor C1 is connected between the antenna terminal 21 and the ground.

Figure 3:
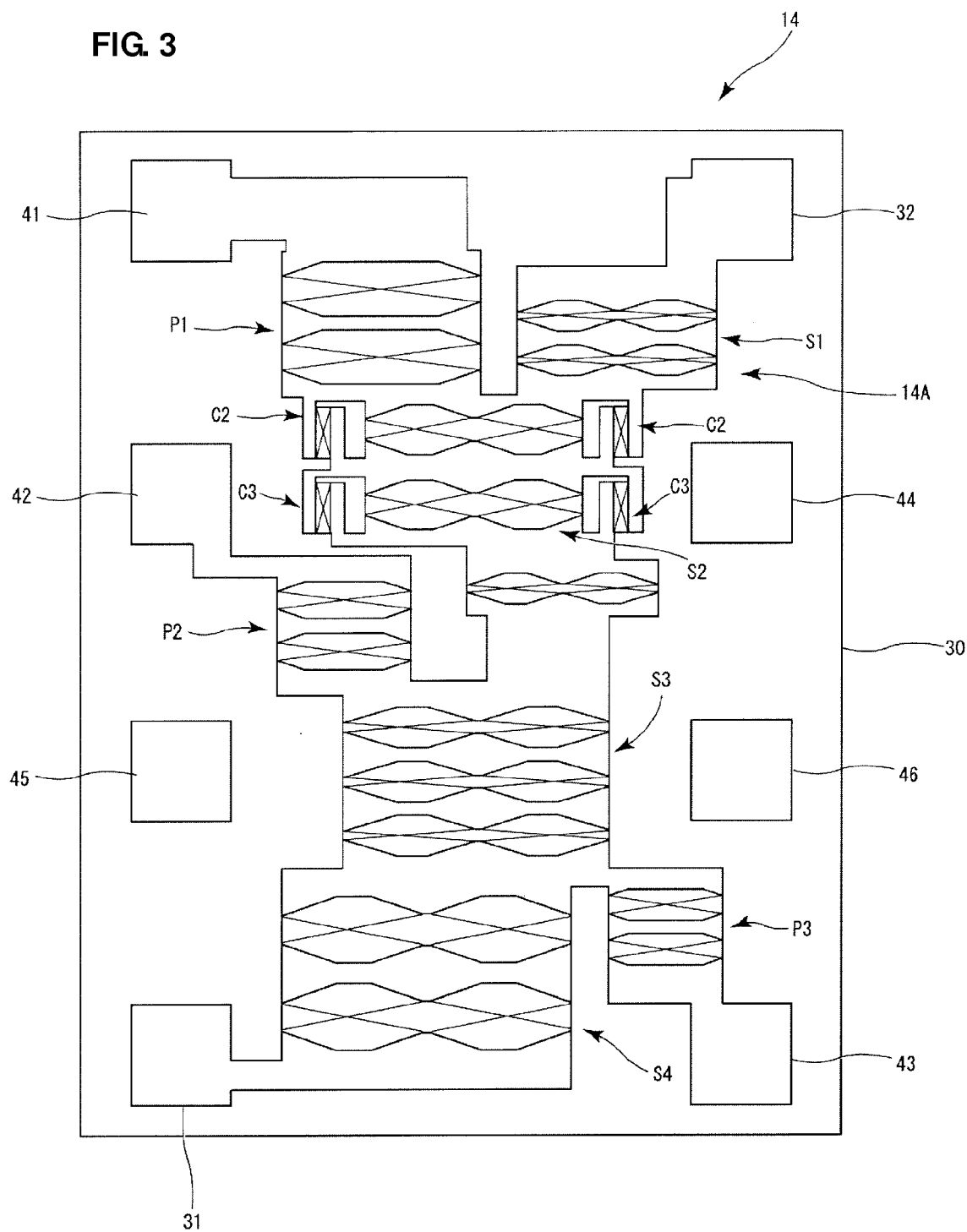
FIG. 3 is a schematic perspective plan view of a transmission side surface acoustic wave filter chip in the duplexer according to a preferred embodiment of the present invention.
Figure 4:
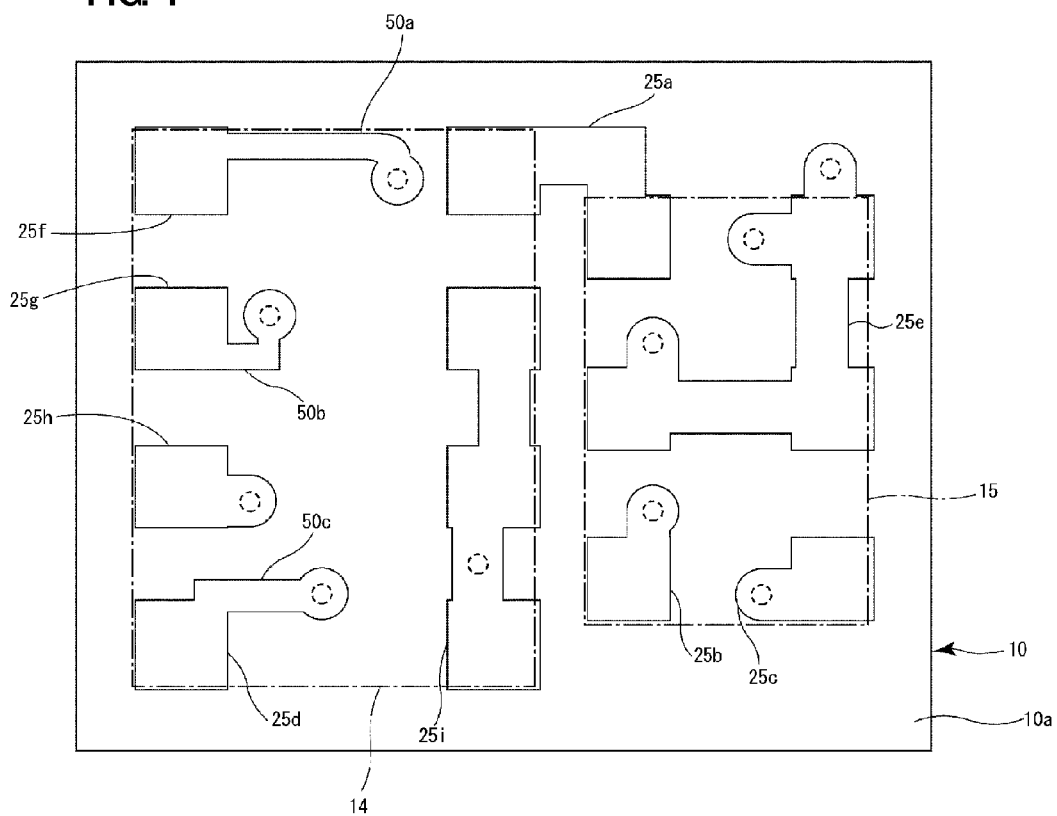
FIG. 4 is a schematic plan view of a die-attach surface of a wiring board in the duplexer according to a preferred embodiment of the present invention.
Figure 5:
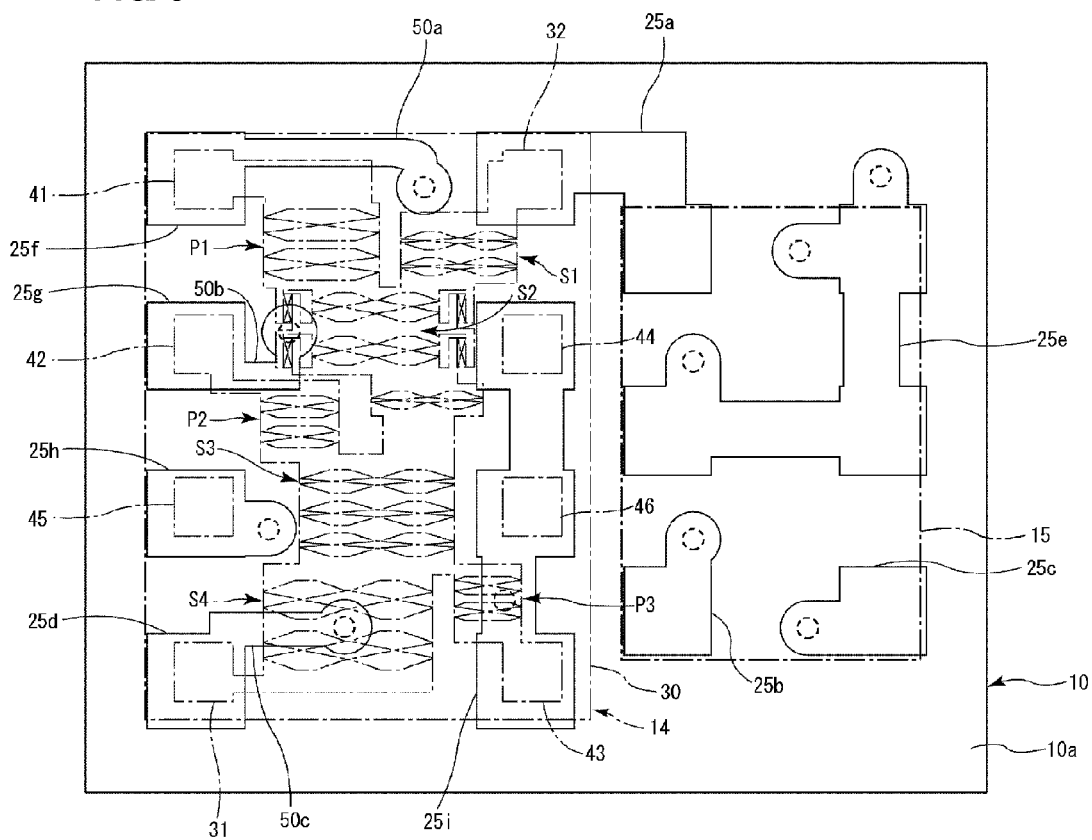
FIG. 5 is a schematic perspective plan view of the duplexer according to a preferred embodiment of the present invention.

Next, a specific configuration of the transmission filter will be described with reference primarily to FIGS. 3 to 5. FIG. 3 is a schematic perspective plan view of the transmission side surface acoustic wave filter chip 14 in the duplexer 1 of the present preferred embodiment. Specifically, FIG. 3 shows the electrode structure of the transmission side surface acoustic wave filter chip 14 in a state in which the transmission side surface acoustic wave filter chip 14 is seen through from above the duplexer 1. FIG. 4 is a schematic plan view of the die-attach surface 10a of the wiring board 10 in the duplexer 1 of the present preferred embodiment. In FIG. 4, as indicated by alternate long and short dash lines, the transmission side surface acoustic wave filter chip 14 and the reception side surface acoustic wave filter chip 15 are flip-chip-mounted. FIG. 5 is a schematic perspective plan view of the duplexer 1 of the present preferred embodiment. Specifically, FIG. 5 shows a state where the duplexer 1 is seen through from above.

As shown in FIG. 3, the transmission side surface acoustic wave filter chip 14 includes a piezoelectric substrate 30. On the piezoelectric substrate 30, an output pad 32, an input pad 31, the series arm resonators S1 to S4, the parallel arm resonators P1 to P3, the capacitors C2 and C3, grounding pads 41 to 43, and dummy pads 44 to 46 are provided.

The output pad 32 is connected to the antenna terminal 21. The input pad 31 is connected to the transmission side signal terminal 24. The grounding pads 41 to 43 are connected to the ground. The bumps 11 are provided on the input pad 31, the output pad 32, the grounding pads 41 to 43 and the dummy pads 44 to 46.

Each of the surface acoustic wave resonators defining each of the series arm resonators S1 to S4 and the parallel arm resonators P1 to P3 includes an IDT electrode provided on the piezoelectric substrate 30, and a pair of reflectors located on both sides of the IDT electrode in a direction in which a surface acoustic wave propagates. The capacitors C2 and C3 are defined by two pairs of comb electrodes, respectively. The piezoelectric substrate 30 may preferably be made of a piezoelectric monocrystalline substrate of $LiNbO_3$, $LiTaO_3$, or other suitable material, for example.

As shown in FIG. 4, a plurality of land electrodes 25a to 25i connected to the transmission side surface acoustic wave filter chip 14 and the reception side surface acoustic wave filter chip 15, and a plurality of wiring electrodes 50a to 50c, are provided on the die-attach surface 10a of the wiring board 10.

The land electrode 25a is connected to the output pad 32 of the transmission side surface acoustic wave filter chip 14 and the unbalanced signal terminal 15a of the reception side surface acoustic wave filter chip 15 through the bumps 11. The land electrode 25a is connected to the antenna terminal 21 through an electrode formed within the wiring board 10. The land electrode 25b is connected to the first balanced signal terminal 15b of the reception side surface acoustic wave filter chip 15 through the bump 11. The land electrode 25b is connected to the first reception side signal terminal 22a through an electrode disposed within the wiring board 10. The land electrode 25c is connected to the second balanced signal terminal 15c of the reception side surface acoustic wave filter chip 15 through the bump 11. The land electrode 25c is connected to the second reception side signal terminal 22b through an electrode disposed within the wiring board 10. The land electrode 25d is connected to the input pad 31 of the transmission side surface acoustic wave filter chip 14 through the bump 11.

The land electrode 25e is connected to a ground electrode of the reception side surface acoustic wave filter chip 15 through the bump 11. The land electrode 25f is connected to the grounding pad 41 of the transmission side surface acoustic wave filter chip 14 through the bump 11. The land electrode 25g is connected to the grounding pad 42 of the transmission side surface acoustic wave filter chip 14 through the bump 11. The land electrode 25h is connected to the dummy pad 45 of the transmission side surface acoustic wave filter chip 14 through the bump 11. The land electrode 25i is connected to the grounding pad 43 and the dummy pads 44 and 46 of the transmission side surface acoustic wave filter chip 14 through the bump 11. The land electrodes 25e, 25h, and 25i are connected to a ground terminal among the terminals 26 through electrodes disposed within the wiring board 10.

The wiring electrode 50a is preferably an inductor electrode that defines the inductor L2. The wiring electrode 50a is connected to the land electrode 25f. The wiring electrode 50b is preferably an inductor electrode that defines the inductor L3. The wiring electrode 50b is connected to the land electrode 25g. The wiring electrodes 50a and 50b are connected to the ground terminal among the terminals 26 through electrodes disposed within the wiring board 10. The wiring electrode 50c is connected to the land electrode 25d. The wiring electrode 50c is connected to the transmission side signal terminal 24 through an electrode disposed within the wiring board 10.

In the duplexer 1 of the present preferred embodiment, the wiring electrodes 50a to 50c are preferably arranged so as not to face the IDT electrode defining any one of the surface acoustic wave resonators among the pluralities of surface acoustic wave resonators defining the series arm resonators S1 to S4 and the parallel arm resonators P1 to P3, other than the surface acoustic wave resonator having a smallest amount of heat generation per unit time when a signal flows between the antenna terminal 21 and the transmission side signal terminal 24. Specifically, the wiring electrodes 50a to 50c are preferably arranged so as not to face the IDT electrode defining the surface acoustic wave resonator having a largest amount of heat generation per unit time when a signal flows between the antenna terminal 21 and the transmission side signal terminal 24 among the pluralities of surface acoustic wave resonators constituting the series arm resonators S1 to S4 and the parallel arm resonators P1 to P3. More specifically, the wiring electrodes 50a to 50c are preferably arranged so as not to face the surface acoustic wave resonators among the pluralities of surface acoustic wave resonators defining the series arm resonators S1 to S4 and the parallel arm resonators P1 to P3, other than the two surface acoustic wave resonators defining the series arm resonator S4.

In the present preferred embodiment, among the pluralities of surface acoustic wave resonators defining the series arm resonators S1 to S4 and the parallel arm resonators P1 to P3, the surface acoustic wave resonator having a largest amount of heat generation per unit time when a signal flows between the antenna terminal 21 and the transmission side signal terminal 24 is the surface acoustic wave resonators defining the series arm resonator S2. However, among the pluralities of surface acoustic wave resonators defining the series arm resonators S1 to S4 and the parallel arm resonators P1 to P3, the surface acoustic wave resonator having a largest amount of heat generation is changed depending on design parameters of each surface acoustic wave resonator, the frequency of a signal flowing between the antenna terminal 21 and the transmission side signal terminal 24, and other relevant factors. Thus, the surface acoustic wave resonators defining the series arm resonator S2 do not always necessarily have a large amount of heat generation.

Among the pluralities of surface acoustic wave resonators of the transmission side surface acoustic wave filter chip 14, a surface acoustic wave resonator that provides a frequency band in which power is applied in the passband of the transmission filter and that has a high impedance, namely, a low capacitance is likely to be the surface acoustic wave resonator having a largest amount of heat generation. Further, among the pluralities of surface acoustic wave resonators of the transmission side surface acoustic wave filter chip 14, a surface acoustic wave resonator that provides a frequency band in which insertion loss is the greatest in the passband of the transmission filter is likely to be the surface acoustic wave resonator having a largest amount of heat generation.

Meanwhile, when a signal flows between the antenna terminal and the transmission side signal terminal, not only the pluralities of surface acoustic wave resonators defining the series arm resonators and the parallel arm resonators but also the land electrodes and the wiring electrodes provided on the die-attach surface of the wiring board generate heat. Thus, at a location at which the wiring electrode provided on the die-attach surface of the wiring board and the IDT electrode defining the surface acoustic wave resonator face each other, both heat generated by the surface acoustic wave resonator and heat generated by the wiring electrode provided on the die-attach surface of the wiring board are added to the IDT electrode. Thus, the amount of heat added to the IDT electrode increases. When the amount of heat added to the IDT electrode increases, an electrode finger is likely to be broken due to the synergistic effect of stress migration and heat. As a result, the power durability of the surface acoustic wave filter device deteriorates.

On the other hand, in the present preferred embodiment, as described above, the wiring electrodes 50a to 50c are preferably arranged so as not to face the IDT electrode defining any one of the surface acoustic wave resonators among the plurality of surface acoustic wave resonators defining the series arm resonators S1 to S4 and the parallel arm resonators P1 to P3, other than the surface acoustic wave resonator having a smallest amount of heat generation per unit time when a signal flows between the antenna terminal 21 and the transmission side signal terminal 24. Thus, the amount of heat added to the IDT electrode defining any one of the surface acoustic wave resonators other than the surface acoustic wave resonator having a smallest amount of heat generation per unit time when a signal flows between the antenna terminal 21 and the transmission side signal terminal 24, is significantly reduced. Thus, deterioration of the power durability of the transmission filter is minimized or prevented, and the duplexer 1 having excellent power durability is obtained.

In particular, in the present preferred embodiment, the wiring electrodes 50a to 50c are preferably arranged so as not to face the IDT electrode defining the surface acoustic wave resonator that has a largest amount of heat generation per unit time when a signal flows between the antenna terminal 21 and the transmission side signal terminal 24 and that is most easily broken, among the pluralities of surface acoustic wave resonators defining the series arm resonators S1 to S4 and the parallel arm resonators P1 to P3. Therefore, the power durability of the transmission filter of the duplexer 1 is more effectively improved.

Further, in the present preferred embodiment, breakage of the IDT electrode is prevented in the transmission filter to which greater power is applied than to the reception filter. Therefore, the power durability of the duplexer 1 is further improved.

Hereinafter, the beneficial effects and advantages provided by the preferred embodiment described above will be described in more detail with reference to a specific example.

As an example, the duplexer 1 of the preferred embodiment described above was produced, and, as a comparative example, a duplexer 200 was produced which has substantially the same configuration as that of the duplexer 1 according to the example except that the shapes of the wiring electrodes 50a and 50b defining the inductors L2 and L3 are different. The inductance values of the inductors L2 and L3 in the duplexer 200 of the comparative example were set to be substantially the same as the inductance values of the inductors L2 and L3 of the duplexer 1 according to the example. In the description of the example and the comparative example, the components having substantially the same functions as those in the preferred embodiment described above are designated by the same reference sings, and the description thereof is omitted.

Figure 6:
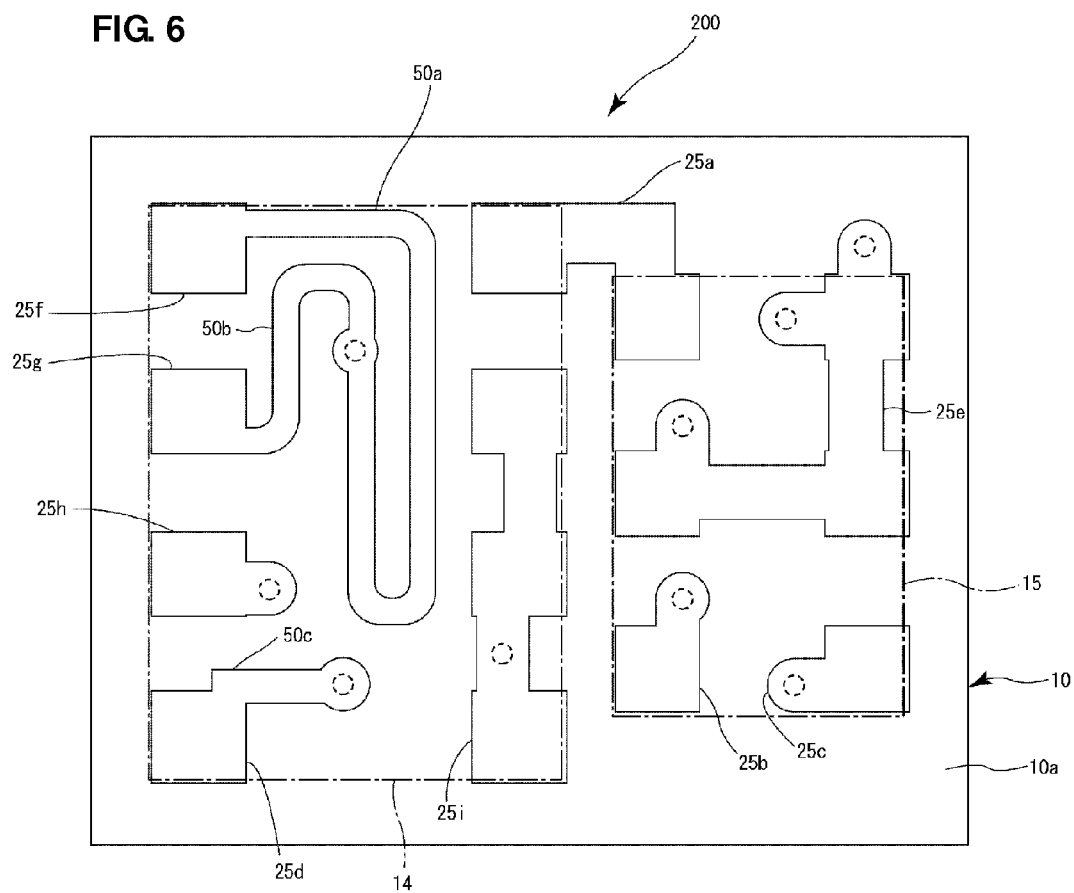
FIG. 6 is a schematic plan view of a die-attach surface of a wiring board in a duplexer of a comparative example.
Figure 7:
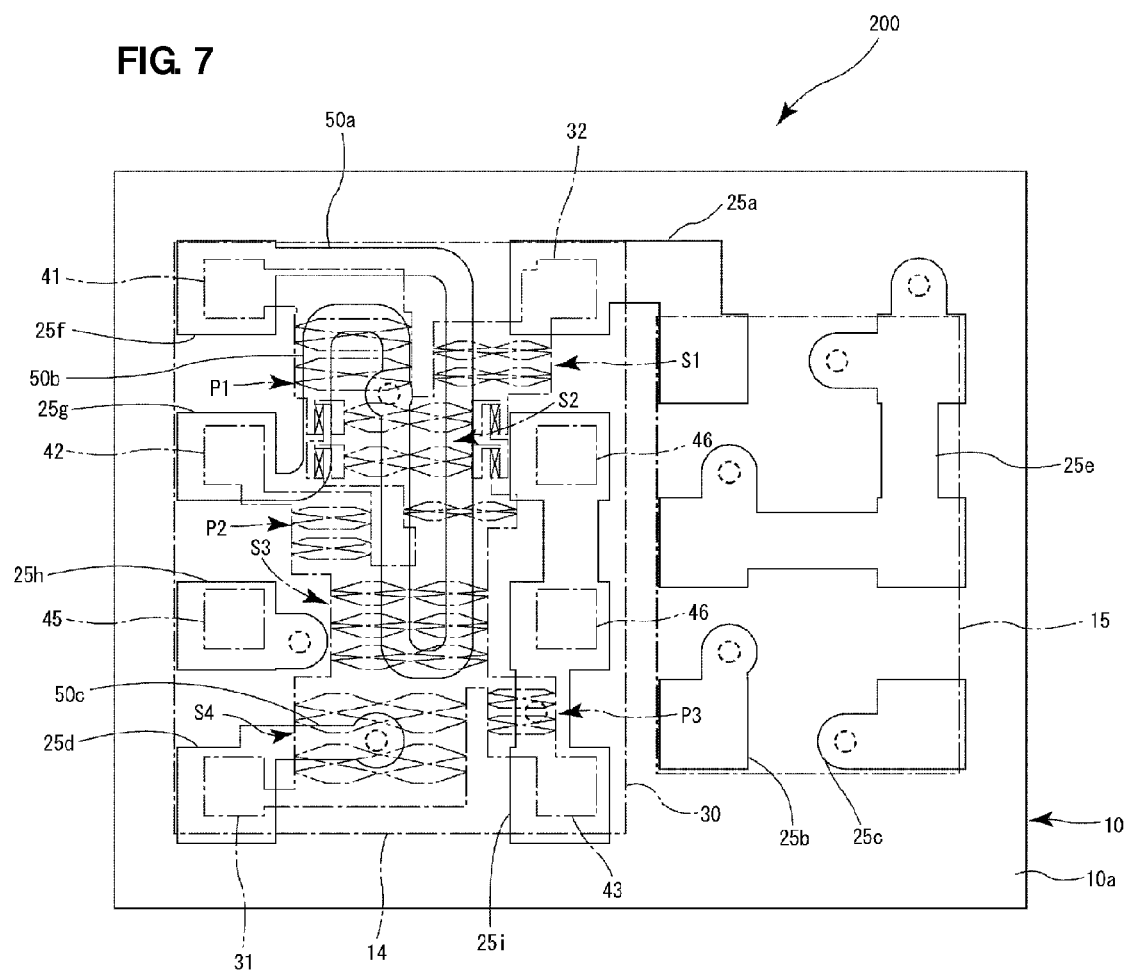
FIG. 7 is a schematic perspective plan view of the duplexer of the comparative example.

FIG. 6 is a schematic plan view of the die-attach surface 10a of the wiring board 10 in the duplexer 200 of the comparative example. In FIG. 6, as indicated by alternate long and short dash lines, the transmission side surface acoustic wave filter chip 14 and the reception side surface acoustic wave filter chip 15 are flip-chip-mounted. FIG. 7 is a schematic perspective plan view of the duplexer 200 of the comparative example. Specifically, FIG. 7 shows a state in which the duplexer 200 of the comparative example is seen through from above.

As shown in FIGS. 6 and 7, in the duplexer 200 of the comparative example, the wiring electrode 50a faces the eight surface acoustic wave resonators defining the series arm resonators S1, S2, and S3. The wiring electrode 50b faces the two surface acoustic wave resonators defining the parallel arm resonator P1.

The wiring electrodes 50a and 50b in the example are shorter than the wiring electrodes 50a and 50b in the comparative example. However, in the example, the inductors L2 and L3 are defined by the wiring electrodes 50a and 50b and electrodes disposed within the wiring board 10, and thus, the inductance values of the inductors L2 and L3 are set to be substantially the same in the example and the comparative example.

Next, the temperatures of the duplexer 1 according to the example and the duplexer 200 according to the comparative example in a state in which a power of about 0.8 W (about 28 dBm) was applied at an atmosphere temperature of about 55° C. were measured with a thermal analysis apparatus using infrared radiation. As a result, in both the duplexer 1 of the example and the duplexer 200 of the comparative example, the region in which the surface acoustic wave resonators defining the series arm resonator S2 are provided had a highest temperature. In addition, the highest temperature of the transmission side surface acoustic wave filter chip 14 of the duplexer 1 of the example was about 96° C., and the highest temperature of the transmission side surface acoustic wave filter chip 14 of the duplexer 200 of the comparative example was about 111° C. From the result, it appears that the heat radiation of the duplexer 1 of the example is greater than that of the duplexer 200 of the comparative example, the amount of heat added to the surface acoustic wave resonators in a state in which power is applied is small, and the temperatures of the surface acoustic wave resonators are relatively low. Therefore, the duplexer 1 of the example has improved power durability as compared to that of the duplexer 200 of the comparative example.

Hereinafter, another example and a modified example of a preferred embodiment of the present invention will be described. In the following description, the components having substantially the same functions as those in the preferred embodiment described above are designated by the same reference sings, and the description thereof is omitted.

Figure 8:
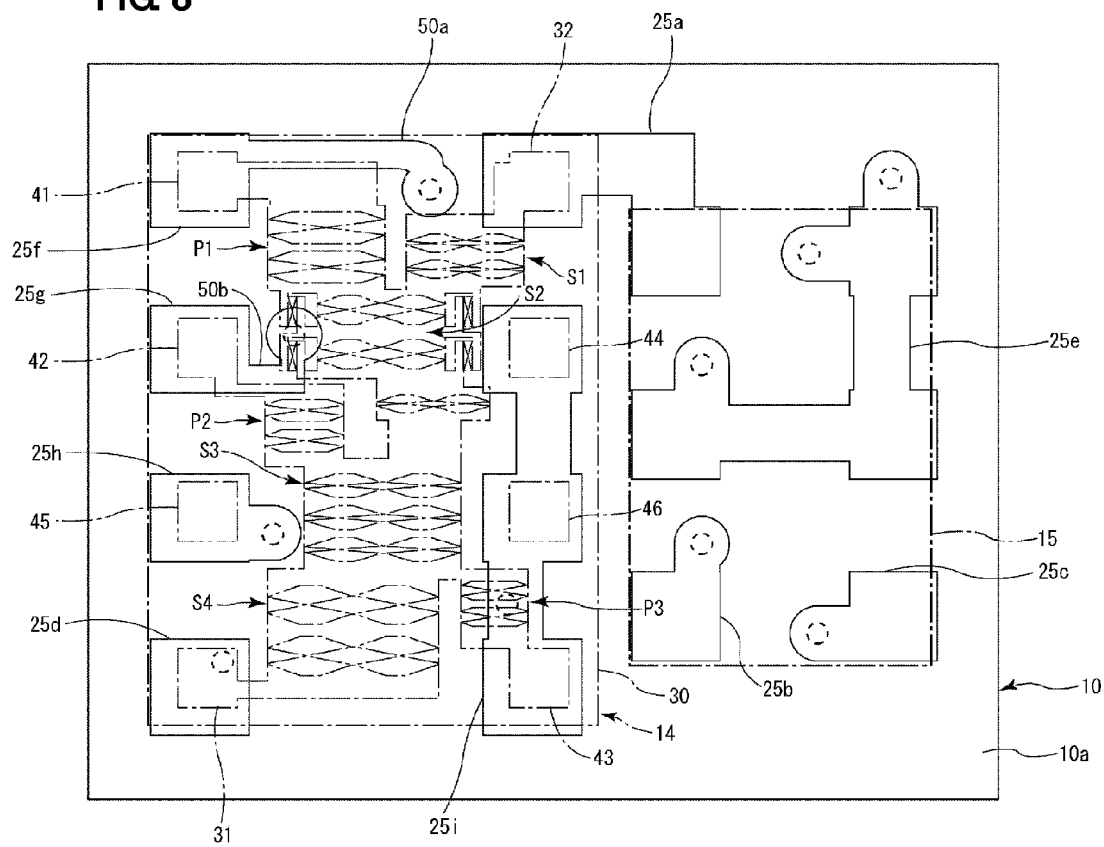
FIG. 8 is a schematic perspective plan view of a duplexer according to another preferred embodiment of the present invention.
Figure 9:
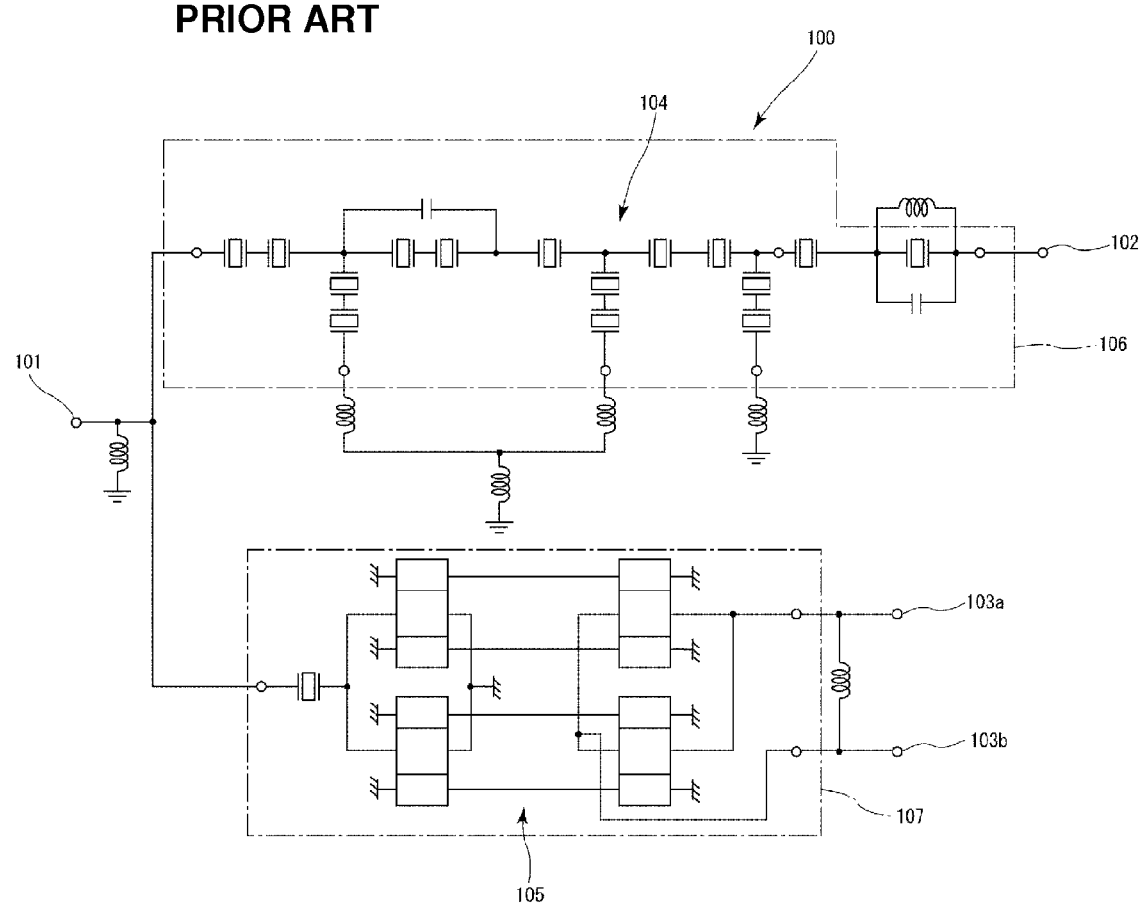
FIG. 9 is a schematic circuit diagram of an example of a surface acoustic wave demultiplexer according to the related art.

FIG. 8 is a schematic perspective plan view of a duplexer according to another preferred embodiment of the present invention.

In the preferred embodiment described above, among the wiring electrodes 50a to 50c, the electrodes 50a and 50b are provided so as not to face the IDT electrodes of the surface acoustic wave resonators, but the wiring electrode 50c is provided so as to face the IDT electrodes of the surface acoustic wave resonators constituting the series arm resonator S4.

On the other hand, in the other preferred embodiment shown in FIG. 8, the wiring electrode 50c is not provided. By so doing, the power durability of the duplexer can be improved further.

Further, in the preferred embodiment described above, the transmission filter of the duplexer is preferably defined by a ladder type surface acoustic wave filter. However, in preferred embodiments of the present invention, the reception filter of the duplexer may be defined by a ladder type surface acoustic wave filter.

Further, in the preferred embodiment described above, the duplexer is described as an example of the surface acoustic wave filter device according to a preferred embodiment of the present invention. The surface acoustic wave filter device according to preferred embodiments of the present invention may not be a demultiplexer, and may be an inter-stage filter or other suitable filter included in an RF circuit, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter device comprising:
first and second signal terminals;
a surface acoustic wave filter portion connected between the first signal terminal and the second signal terminal and including a plurality of surface acoustic wave resonators;
a surface acoustic wave filter chip in which the plurality of surface acoustic wave resonators are provided; and
a wiring board including first and second principal surfaces, the surface acoustic wave filter chip being mounted on the first principal surface, the first and second signal terminals being provided on the second principal surface, the wiring board including a plurality of land electrodes provided on the first principal surface and connected to the surface acoustic wave filter chip, and a wiring electrode provided on the first principal surface and connected to at least one of the plurality of land electrodes; wherein
the surface acoustic wave filter chip includes a piezoelectric substrate and IDT electrodes that are provided on a surface of the piezoelectric substrate that faces the wiring board, and that define the plurality of surface acoustic wave resonators; and
an IDT electrode defining any one of the plurality of surface acoustic wave resonators except for the IDT electrode having a smallest amount of heat generation per unit time when a signal flows between the first and second signal terminals, does not face the wiring electrode.

2. The surface acoustic wave filter device according to claim 1, wherein an IDT electrode defining one of the plurality of the surface acoustic wave resonator that has a largest amount of heat generation per unit time when a signal flows between the first and second signal terminals does not face the wiring electrode.

3. The surface acoustic wave filter device according to claim 1, wherein all of the IDT electrodes defining the plurality of surface acoustic wave resonators do not face the wiring electrode.

4. The surface acoustic wave filter device according to claim 1, wherein the surface acoustic wave filter portion is a ladder type surface acoustic wave filter portion.

5. The surface acoustic wave filter device according to claim 1, wherein the wiring electrode defines an inductor.

6. The surface acoustic wave filter device according to claim 1, wherein the surface acoustic wave filter portion defines a transmission filter.

* * * * *